United States Patent
Laub, III

(10) Patent No.: US 11,342,914 B2
(45) Date of Patent: May 24, 2022

(54) INTEGRATED CIRCUIT HAVING STATE MACHINE-DRIVEN FLOPS IN WRAPPER CHAINS FOR DEVICE TESTING

(71) Applicant: Juniper Networks, Inc., Sunnyvale, CA (US)

(72) Inventor: Gustav Laub, III, San Jose, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 16/906,877

(22) Filed: Jun. 19, 2020

(65) Prior Publication Data

US 2021/0399729 A1 Dec. 23, 2021

(51) Int. Cl.
| | |
|---|---|
| *G06F 30/30* | (2020.01) |
| *H03K 19/00* | (2006.01) |
| *H03K 19/08* | (2006.01) |
| *H01L 27/02* | (2006.01) |
| *H01L 27/28* | (2006.01) |
| *G01R 31/317* | (2006.01) |

(52) U.S. Cl.
CPC ... *H03K 19/0016* (2013.01); *G01R 31/31702* (2013.01); *H01L 27/0233* (2013.01); *H01L 27/285* (2013.01); *H03K 19/0813* (2013.01)

(58) Field of Classification Search
CPC .......... H03K 19/0016; H03K 19/0813; G01R 31/31702; H01L 27/285; H01L 27/0233
USPC ........................................................ 716/106
See application file for complete search history.

(56) References Cited

U.S. PATENT DOCUMENTS

| | | | |
|---|---|---|---|
| 8,832,608 B1 * | 9/2014 | Chakrabarty | ......... G06F 30/327 |
| | | | 716/51 |
| 9,476,940 B2 | 10/2016 | Zimmerman | |
| 9,977,081 B2 | 5/2018 | Serrer et al. | |
| 10,234,504 B1 | 3/2019 | Mukherjee et al. | |
| 10,289,577 B2 * | 5/2019 | Karri | ................... G06F 13/4282 |
| 10,310,013 B2 * | 6/2019 | Ge | ................... G01R 31/31721 |
| 2007/0061657 A1 | 3/2007 | Chang et al. | |
| 2012/0124439 A1 | 5/2012 | Kim et al. | |

(Continued)

FOREIGN PATENT DOCUMENTS

| | | |
|---|---|---|
| TW | 201502546 A | 1/2015 |
| TW | 201626399 A | 7/2016 |

OTHER PUBLICATIONS

Extended Search Report from counterpart European Application No. 20195107.6, dated Feb. 26, 2021, 8 pp.

(Continued)

*Primary Examiner* — Jack Chiang
*Assistant Examiner* — Brandon Bowers
(74) *Attorney, Agent, or Firm* — Shumaker & Sieffert, P.A.

(57) ABSTRACT

Integrated circuits are described that utilize internal state machine-driven logic elements (e.g., flops) within input and/or output wrapper chains that are used to test internal core logic of the integrate circuit. One or more individual logic elements of the wrapper chains within the integrated circuit is implemented as a multi-flop state machine rather than a single digital flip-flop. As multi-flop state machines, each enhanced logic element of a wrapper chain is individually configurable to output pre-selected values so as to disassociate the state machine-driven flops from signal transmission delays that may occur in the input or output wrapper chains of the integrated circuit.

20 Claims, 7 Drawing Sheets

(56) References Cited

U.S. PATENT DOCUMENTS

2018/0164376 A1  6/2018  Ge et al.
2020/0132762 A1  4/2020  Kukreja et al.

OTHER PUBLICATIONS

Goel et al., "Testing of SoCs with Hierarchical Cores: Common Fallacies, Test Access Optimization, and Test Scheduling," IEEE Transactions on Computers, vol. 58, No. 3, Mar. 2009, pp. 409-423.
Notice of Preliminary Rejection, and translation thereof, from counterpart Korean Application No. 10-2020-0114429 dated Dec. 28, 2021, 5 pp.

* cited by examiner

INTEGRATED CIRCUIT HAVING STATE MACHINE-DRIVEN FLOPS IN WRAPPER CHAINS FOR DEVICE TESTING

TECHNICAL FIELD

The disclosure relates to application-specific integrated circuits (ASICs), integrated circuits (ICs), and other circuits.

BACKGROUND

A semiconductor integrated circuit (also referred to as a "chip"), such as an application-specific integrated circuit (ASIC), includes many different types of logic elements such as logic gates, flip-flops, and multiplexers. Data processing integrated circuits, such as packet processing ASICs, including internal logic elements that operate on data and ultimately control the flow of data through the chip. In some examples, a tester performs a test to determine whether data flows through the chip in an expected manner. For example, the tester delivers data for input to the chip, receives data output from the chip, and compares the data output from the chip with expected output data. Based on the comparison, the tester may identify one or more defects in the chip.

SUMMARY

This disclosure describes examples of an integrated circuit that utilizes internal state machine-driven logic elements (e.g., flops) within input and/or output wrapper chains that are used to test the internal core logic of the integrate circuit. As described herein, one or more individual logic elements of the wrapper chains within the integrated circuit is implemented as a corresponding, multi-flop state machine rather than a single digital flip-flop. Moreover, each state machine-driven logic element of the wrapper chains is capable of operating in a one of a set of programmable operational modes to provide desired behaviors during testing of the integrated circuit.

More specifically, as multi-flop state machines, each enhanced logic element of a wrapper chain is individually configurable to output pre-selected values so as to disassociate the state machine-driven flops from signal transmission delays that may occur in the input or output wrapper chains of the integrated circuit. During testing of the core logic of the integrated circuit, flops in the input or output wrapper chain are typically connected in series, with each flop in a given input wrapper chain providing an output to the core logic and to a successive flop in the input wrapper chain. Due to a slow interconnect (e.g., a bandwidth constrained internal electrical connection, distance between flops, etc.) between successive flops in the input wrapper chain, an output from a conventional flop in a wrapper chain may be unknown (e.g., because a flop outputted data before data was received at its input) for a short period of time. As described herein, by utilizing a corresponding state machine-driven flop in place of one or more conventional flops in an input or output wrapper chain, the example techniques described herein may provide immunity from the slow connections (e.g., internal transmission delays) that would otherwise lead to undefined states in the input or output wrapper chain. For example, because the state machine-driven flops may be configured to operate in scan modes that define pre-selected output values, the output of these elements of the wrapper chain can be decoupled from input value(s) of the logic element at times which the input signal may be indeterminate due to transmission delay along the scan path of a given wrapper chain.

In this way, the techniques herein describe enhanced wrapper chains in which a conventional flop at the receiving end of a slow interconnect along a scan path is replaced with additional circuitry in order to create the state machine-driven multi-flop logic element referred to herein as a 'state machine-driven flop'. As further described, when configured to operate in a scan mode, the state machine-driven flop no longer relies on an input signal from the slow connection in order for the state machine-driven flop to operate during a capture phase of the testing in order to capture the expected data bit value. In other words, converting at least one flop of a wrapper chain into a state machine-driven flop allows the core logic to capture all the expected input data bit values during the capture phase even though one or more slow connections may exist in the scan paths of and input or output wrapper chain.

In this way, in some examples, the state machine-driven flops are individually configurable which provides flexibility to output pre-selected values according the programmable operational modes. For example, as described in more detail, a state machine-driven flop of a wrapper chain may be configured to provide, during the capture phase, a constant output based on a current value previously shifted into the flop (e.g., a maintain operational mode) that was shifted in during the load phase rather than provide an output based on an input signal present at an input of the flop. As another example, a state machine-driven flop in the input or output wrapper chain may be configured to output, during the capture phase, an inverse of the current value previously shifted in the flop (e.g., toggle operational mode) that was shifted in during the load phase rather than based on the input received at the flop. In this way, the state machine-driven flops may be used within slow wrapper chain paths, as described herein, to provide fine grain control over the values and/or transitions presented at the functional and scan outputs during the capture phase, thereby eliminating any timing issues that may otherwise arise due to slow internal wrapper chain paths within the integrated circuit.

In some examples, this disclosure describes an integrated circuit (IC) comprising a core logic having functional logic elements and a wrapper chain having a plurality of flops for testing the core logic. The plurality of flops of the wrapper chain are sequentially interconnected along a scan path for shifting scan data through successive ones of the flops during testing of the core logic. The IC also includes at least one state machine-driven flop connected along the scan path of the wrapper chain. The state machine-driven flop is individually configurable, during the testing, to output a value independent from the scan data being shifted along the scan path and received by the state machine-driven flop.

In some examples, this disclosure describes a system comprising a tester and an integrated circuit (IC). The IC includes a core logic having functional logic elements and an input wrapper chain having a plurality of flops for testing the core logic. The plurality of flops of the wrapper chain are sequentially interconnected along a scan path for shifting scan data through successive ones of the flops during testing of the core logic. The IC also includes an output wrapper chain and at least one state machine-driven flop connected along the scan path of the input wrapper chain. The state machine-driven flop is individually configurable, during the testing, to output a value independent from the scan data being shifted along the scan path and received by the state machine-driven flop. In one or more examples, the input wrapper chain is configured to load, during a load phase responsive to receiving a set of load phase clock signals at a slow clock frequency, an input string of data from the tester so as to load values into the plurality of flops and configure the state machine-driven flop to output the value independent from the scan data being shifted along the scan path. In one or more examples, the output wrapper chain is configured to capture, during a capture phase responsive to receiving a set of capture phase clock signals at a fast clock frequency, a captured string of data from a plurality of functional paths through the core logic and unload, during an unload phase responsive to receiving a set of unload phase clock signals at the slow clock frequency, the captured string of data to the tester.

The summary is intended to provide an overview of the subject matter described in this disclosure. It is not intended to provide an exclusive or exhaustive explanation of the systems, device, and methods described in detail within the accompanying drawings and description below. Further details of one or more examples of this disclosure are set forth in the accompanying drawings and in the description below. Other features, objects, and advantages will be apparent from the description and drawings, and from the claims.

BRIEF DESCRIPTION OF DRAWINGS

Like reference characters refer to like elements throughout the text and figures.

DETAILED DESCRIPTION

Figure 1:
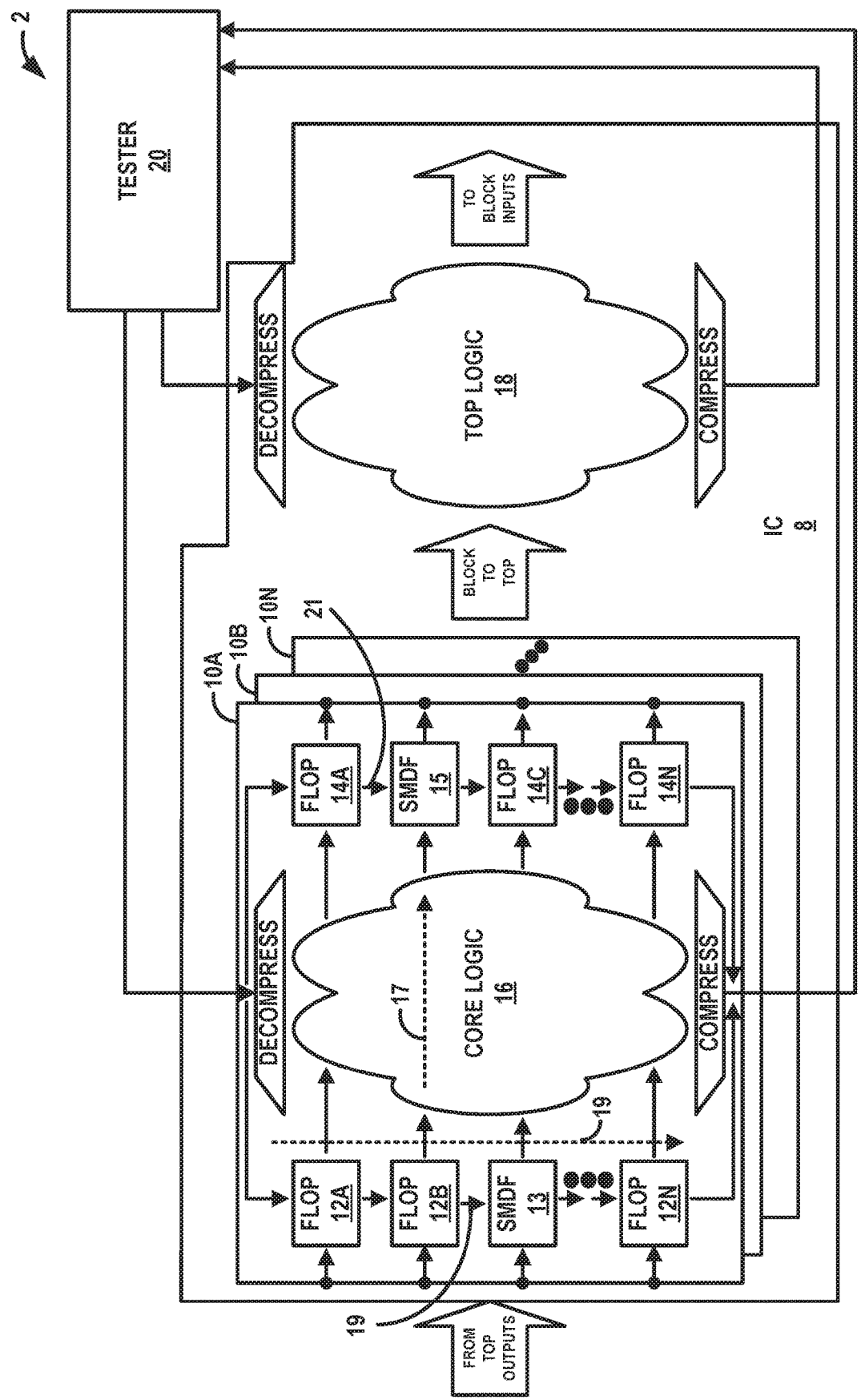
FIG. 1 is a block diagram illustrating an example system including a set of logic blocks having one or more state machine-driven flops in an input or output wrapper chain, in accordance with one or more techniques of this disclosure.

FIG. 1 is a block diagram illustrating an example system 2 in which an integrated circuit 8 of a semiconductor device includes a set of logic blocks 10A-10N (collectively, "logic blocks 10") having one or more state machine-driven flops in an input wrapper chain or output wrapper chain for testing integrated circuit 8, in accordance with one or more techniques of this disclosure. As seen in FIG. 1, in this example, system 2 includes integrated circuit (IC) 8, which includes logic blocks 10 and top logic 18. System 2 also includes tester 20. Logic block 10A includes a first set of input/output (I/O) flops 12A-12N (collectively, "flops 12"), a second set of I/O flops 14A-14N (collectively, "flops 14") and core logic 16. As described in more detail, flops 12 form an input wrapper chain and flops 14 form an output wrapper chain. In one or more examples, as described in more detail, one of the flops 12 or flops 14 may be replaced with a state machine-driven multi-flop logic element referred to herein as a "state machine-driven flop" or SMDF. For example, FIG. 1 illustrates SMDF 13 in the input wrapper chain and illustrates SMDF 15 is the output wrapper chain.

Although one SMDF 13 is illustrated in the input wrapper chain, there may be a plurality of SMDFs in the input wrapper chain. Although one SMDF 15 is illustrated in the output wrapper chain, there may be a plurality of SMDFs in the output wrapper chain. In some examples, there may be one or more SMDFs, like SMDF 13, in the input wrapper chain, and no SMDFs in the output wrapper chain. In some examples, there may be one or more SMDFs, like SMDF 15, in the output wrapper chain, and no SMDFs in the input wrapper chain.

In some cases, IC 8 is an application specific integrated circuit (ASIC), and logic blocks 10 and top logic 18 represent components of the ASIC, but this is not required. Logic blocks 10 and top logic 18 may be components of other kinds of circuits in some cases.

Each logic block of logic blocks 10 include one or more semiconductor-based logic elements configured to control a flow of data. For example, FIG. 1 illustrates functional path 17, which represents a chain of one or more logic elements within core logic 16 that are configured to process electrical signals (e.g., data bits) according to the functional logic elements within core logic 16. That is, during normal operation of IC 8, functional path 17 represents the path through functional logic elements of core logic 16 from input to output. For example, functional path 17 may accept an input data bit value and generate an output data bit value, the output data value being generated in response to the logic elements of the path applying the one or more logical operations to the data bit value. In some examples, core logic 16 may include one or more core flops. One or more of functional paths 17 may start with a respective core flop and end with one of flops 14. One or more of functional paths 17 may start with one of flops 12 and end with one of the core flops.

FIG. 1 also illustrates scan path 19 used for testing integrated circuit 8. Scan path 19 is an example of a path through a wrapper chain formed by a series of flops 12 used to test corresponding logic elements in core logic 16 that receive data from respective flops 12 of the wrapper chain. For instance, as described in more detail, during testing of IC 8, such as testing of core logic 16, scan path 19 represents a path for propagating test data through the wrapper chain, where respective flops 12 are connected successively, and each one of flops 12 receives data from a previous one of flops 12 and outputs to a subsequent flop 12 and to corresponding logic elements in core logic 16.

For example, the wrapper chain (e.g., input wrapper chain) includes a plurality of flops 12 for testing core logic 16. Plurality of flops 12 are sequentially interconnected along a scan path (e.g., scan path 19) for shifting scan data through successive ones of flops 12 during testing of core logic 16. Although described with the input wrapper chain, similar interconnections are utilized for the output wrapper chain with plurality of flops 14.

In some examples, logic block 10A uses functional paths 17 while block 10A is functioning according to an intended purpose. For example, when logic block 10A is applied to process data as it is designed to do, logic block 10A processes the data using the functional paths 17, rather than the scan paths 19. Scan paths 19, on the other hand, are operable during testing.

During the functional mode of system 2, logic block 10A is configured to receive data via flops 12, process the data using core logic 16 according to logical operations of functional paths 17, and output the data to top logic 18 via flops 14. As such, flops 12 may be referred to herein as an "input wrapper chain" which receives data from outside of logic block 10A and flops 14 may be referred to herein as an "output wrapper chain" which forwards data away from logic block 10A after the data is processed by core logic 16.

As described in more detail, SMDF 13 is configured to operate similar to flops 12 in the functional mode. For example, SMDF 13 is configured to output received data to core logic 16. However, during testing, SMDF 13 is configured to output pre-stored data to core logic 16, as well as to a subsequent flop in the input wrapper chain. As illustrated, SMDF 13 is connected along the scan path (e.g., scan path 19) for the wrapper chain (e.g., input wrapper chain). As described in more detail, SMDF 13 is individually configurable, during testing, to output a value independent from the scan data being shifted along the scan path and received by SMDF 13. For example, as described in more detail, during a load phase of the testing, SMDF 13 may be configured to output data received on its input from a previous flop. However, rather than outputting the data received on the input of SMDF 13, during a capture phase, SMDF 13 outputs a value independent from the scan data that is being shifted along the scan path and received by SMDF 13.

For testing, one or more of flops 12 is configurable during testing to output to a successive flop and to core logic 16. One or more of flops 14 is configurable during testing to output to a successive flop and receive from core logic 16. That is, an input wrapper chain includes a first plurality of flops 12, where one or more of the first plurality of flops 12 is configurable during testing to output to a successive flop in the first plurality of flops 12 and to core logic 16. Also, an output wrapper chain includes a second plurality of flops 14, where one or more of the second plurality of flops 14 is configurable during testing to output to a successive flop in the second plurality of flops 14 and to receive from core logic 16. For example, as illustrated, during testing, flop 12A outputs to flop 12B, flop 12B outputs to flop 12C, and so forth to flop 12N, and similarly, during testing, flop 14A outputs to flop 14B, flop 14B outputs to flop 14C, and so forth to flop 14N. Accordingly, for testing, each of flops 12 or flops 14 shift data to successive one of flops 12 or flops 14.

As described in this disclosure, one or more flops of flops 12 or flops 14 are replaced by state machine-driven multi-flop logic elements referred to herein as a 'state machine-driven flop.' For example, rather than there being a flop 12C, flop 12C is replaced by state machine-driven flop (SMDF) 13, and rather than there being a flop 14B, flop 14B is replaced by SMDF 15. SMDF 13 and SMDF 15 are examples of a wrapper cell. For example, SMDF 13 and SMDF 15 include circuitry associated with flops 12 or flops 14 (e.g., flops in a scan wrapper chain such as the input wrapper chain or the output wrapper chain), and provides all of the functions of flops 12 and flops 14 except that SMDF 13 and SMDF 15 are not configured to output successive flop data received on the input of SMDF 13 or SMDF 15 during testing, such as in a capture phase of the testing, as described in more detail.

For example, SMDF 13 and SMDF 15 are individually configurable to output pre-selected values so as to disassociate the SMDF 13 and SMDF 15 from delays in connections in the input wrapper chain or the output wrapper chain. That is, SMDF 13 or SMDF 15 are individually configurable, during the testing, to output a value independent from the scan data being shifted along the scan path and received by SMDF 13 or SMDF 15. This outputting of the value independent from the scan data occurs during a capture phase of the testing, where shift delays impact SMDF 13 or SMDF 15 from timely receiving data. Accordingly, SMDF 13 and SMDF 15 may provide immunity from shift delays of shifting data through the input wrapper chain or the output wrapper chain.

For example, depending upon the particular implementation and layout of the integrated circuit being tested, there may be possibility of a slow signal transmission along a connection between successive flops in the input wrapper chain and/or output wrapper chain relative to signal transmission speed within core logic 16. For example, there may be possibility that a connection between two flops in the input or output wrapper chain propagates data at a rate less than an operation rate of core logic 16 (e.g., less than a rate at which core logic 16 operates or can operate). The slow connection along a scan path 19, for example, can impact testing because it may be possible that an error is caused due to the slow connection as scan data shifts through flops 12/14 along a scan path rather than due to functional circuitry malfunction, such as that of circuitry within core logic 16.

As described in more detail, the slow connection between successive flops can be identified during design, and the flops of flops 12 or flops 14 that are at the end of the slow connection may be replaced with state machine-driven flops that allow selectively setting the output from the state machine-driven flop to a known value regardless of the input to the state machine-driven flop (e.g., independent from the scan data being shifted along the scan path and received by the state machine-driven flops). Therefore, the reliance of the output from the state machine-driven flop being based on the input to the state machine-driven flop is removed, and the impact for the slow connection may be mitigated.

For example, during design, flop 12B may be designed to connect with a similar flop (e.g., flop 12C), and flop 12B and flop 12C may be interconnected by connection 19 (e.g., vias or microstrip). During design, connection 19 may have been identified as a slow connection (e.g., due to the distance between flop 12B and flop 12C, or due to bandwidth constraints on connection 19). For example, data cannot propagate through connection 19 at same speed as data can propagate through core logic 16. Stated another way, connection 19 propagates data at a rate less than an operational rate of core logic 16. Accordingly, flop 12C is replaced with SMDF 13, which is a state machine-driven multi-flop logic element. During testing, such as during a capture phase of the testing, SMDF 13 is configured to output a pre-stored value (e.g., a value shifted into a flop of SMDF 13 or an inverse of a value shifted into a flop of SMDF 13 such as during a load phase), rather than value received at its input during testing. However, during normal operation, SMDF 13 is configured to output to core logic 16 the data received at its functional input.

Similarly, during design, flop 14A may be designed to connect with another flop (e.g., SMDF 15), and flop 14A and SMDF 15 may be interconnected by connection 21. During design, connection 21 may have been identified as a slow connection (e.g., due to distance between flop 14A and flop 14B, or due to bandwidth constraints on connection 21). For example, data cannot propagate through connection 21 at same speed as data can propagate through core logic 16. Accordingly, flop 14B is replaced with SMDF 15, which is a state machine-driven multi-flop logic element. During testing, such as during a capture phase of the testing, SMDF 15 is configured to output a value independent from the scan data being shifted along the scan path and received by the state machine-driven flop.

As illustrated, the testing of IC 8 and logic blocks 10 is performed by tester 20. The use of tester 20 is illustrated for purposes of illustration only. In some examples, tester 20 or functionality of tester 20 may be integrated on IC 8 so that IC 8 has logic test capabilities.

Tester 20 may include, for example, microprocessors, digital signal processors (DSPs), ASICs, field programmable gate arrays (FPGAs), or equivalent discrete or integrated logic circuitry, or a combination of any of the foregoing devices or circuitry. Accordingly, the terms "processor," "controller," or "tester," as used herein, may refer to any one or more of the foregoing structures or any other structure operable to perform techniques described herein. In some examples, tester 20 may execute instructions stored by a memory (not illustrated in FIG. 1) in order to control one or more elements of system 2. For example, tester 20 may configure scan path 19 so that each one of flops 12 outputs to a successive flop 12.

However, where one of flops 12 is replaced by SMDF 13, SMDF 13 may output a current value or an inverse of the current value to a subsequent one of flops 12 rather than the value received at the input of SMDF 13. For example, SMDF 13 is configurable, during testing, to maintain, as output, a current value of SMDF 13 that was shifted into SMDF 13 during a previous shift cycle. As another example, SMDF 13 is configurable, during testing, to output an inverse of a current value of SMDF 13 that was shifted into SMDF 13 during a previous shift cycle. For example, during a load phase of the testing that occurs before a capture phase of the testing, SMDF 13 may have been configured to maintain, as output, a current value of SMDF 13 that was shifted into SMDF 13 during the load phase or may have been configured to output an inverse of the current value of SMDF 13 that was shifted into SMDF 13 during the load phase.

To determine whether IC 8, including logic blocks 10, is performing the desired function, tester 20 performs a test operation of functional paths 17 (e.g., functional logic elements of core logic 16) in order to identify whether a set of data output from flops 14 matches a set of expected data. When the set of data output from flops 14 during a test operation does not match the set of expected data, tester 20 determines that core logic 16 is associated with at least one error. However, if there is a slow connection between flops 12 or flops 14 which causes an error, tester 20 may not be able to determine if the slow connection caused the error or if there is malfunction in core logic 16.

For example, as described in more detail, during a capture phase of the testing, a clock signal causes flops 12 or flops 14 to output to successive flops. The clock signal used for the capture phase is a relatively fast clock signal (e.g., relatively high frequency). If there is a slow connection between successive flops 12 or flops 14, then it may be possible that a flop at the end of the slow connection closes an input sampling window before a bit from the previous flop is at the input of the flop. In this case, the output from the flop may be unknown, and the cause of error (e.g., because of malfunction in core logic 16 or due to slow connection) is unknown.

The testing operation performed by tester 20 includes three phases: a load phase, a capture phase, and an unload phase. During the load phase, tester 20 directs a data pattern including a string of data bits to flops 12, causing flops 12 to "load" the string of data bits while preserving an order of the string of data bits. That is, flop 12N loads a first data bit of the string of data bits, a flop preceding flop 12N loads a second data bit of the string of data bits, and so on. Flops 12 load the string of data bits vertically along the input wrapper chain in response to receiving a set of load phase clock signals at a slow clock frequency. During the load phase, SMDF 13 shifts data received from flop 12B along the scan path.

During the capture phase of the testing operation, flops 12 of the input wrapper chain output the string of data bits for processing by functional paths 17 in response to receiving a set of capture phase clock signals at a fast clock frequency, causing flops 14 of the output wrapper chain to receive a string of "captured" data bits. During the unload phase, flops 14 receive a set of unload phase clock signals at the slow clock frequency, causing flops 14 to unload the string of captured data bits to tester 20. Tester 20 compares the string of captured data bits to an expected string of captured data bits, the comparison revealing whether functional paths 17 cause one or more errors in processing the string of data bits output from flops 12 during the capture phase. Core logic 16 may include one or more core flops and core flop chains. For example, one or more of the core flop chains may output data to tester 20, the data received from flops 12. One or more slow connections between flops 12 might not affect the data received by the core logic chain from flops 12. In this way, a core flop chain may perform one or more techniques described herein as being performed by the output wrapper chain which includes flops 14.

During testing, a set of connections connect flops 12 together. However, during normal operation, flops 12 may not be connected together or may be connected together but the output from a previous flop is not used as an input for the current flop. For example, flops 12 and similarly flops 14 may include a MUX on the input, and the MUX selects between one connection from a previous flop or another connection for regular data (e.g., for flops 12, data from another circuit connected to the ASIC, and for flops 14, data from core logic 16). For the testing, the MUX selects the connection from the previous flop.

However, SMDF 13 and SMDF 15 may be configured to receive data from a previous flop, but do not output the data received from the previous flop, during the capture phase. Instead, SMDF 13 and SMDF 15 output a value or inverse of values already shifted into a flop of SMDF 13 and SMDF 15 that is independent from the scan data being shifted along the scan path and received by SMDF 13 or SMDF 15. In this way, even though connections 19 and 21 are slow connections (e.g., a connection in the scan path that cannot propagate data as fast as inline components of core logic 16), the impact of connections 19 and 21 is mitigated as SMDF 13 and SMDF 15 are configurable to output a current value or inverse of the current value in SMDF 13 or SMDF 15.

That is, for testing, each pair of consecutive flops are connected by a respective connection of the set of connections. For example, flop 12A and flop 12B are linked by a first connection of a set of connections. These connections which link flops 12 represent electrical connections which are configured to carry data, e.g., electrical signals indicating one or more data bit values, between respective flops of the input wrapper chain. These connections sequentially interconnect flops 12 along a scan path for shifting scan data through successive ones of flops 12 during testing of core logic 16.

The bandwidth of the connection links impacts the time it takes for an electrical signal to propagate through each connection of the set of connections which form the input wrapper chain. In some cases, at least one connection of the set of connections which form the input wrapper chain represents a "slow" connection such as connection 19 where an amount of time that it takes for an electrical signal to propagate through the slow connection link 19 is greater than a threshold amount of time. For example, connection 19 between SMDF 13 and a previous flop in the wrapper chain propagates data to SMDF 13 at a rate less than an operational rate of core logic 16 (e.g., connection 19 in the scan path cannot propagate data as fast as inline components of core logic 16). Although described with respect to flops 12, the same may occur with flops 14 in the output wrapper chain.

If the amount of time that it takes for an electrical signal to propagate through the slow connection is greater than the threshold amount of time, the slow connection is unable to operate effectively during the capture phase when flops 12 receive the capture phase clock signals at the fast clock frequency (e.g., frequency at which components of core logic 16 are to operate). In an example where the connection link 19 represents a slow connection, a first capture phase clock signal causes flop 12B to output a data bit value, and a second capture phase clock signal arrives at SMDF 13 before the data bit value arrives at SMDF 13 from flop 12B across the slow connection link 19. If, rather than SMDF 13, flop 12C, which is similar to flop 12B is used, flop 12C would output an erroneous data bit value to core logic 16, adversely affecting a test performed by tester 20.

In other words, tester 20 operates under an assumption that data propagates across each connection of the set of connection in a sufficient amount of time such that each flop of flops 12 outputs, responsive to a capture phase clock signal, a correct data bit value to core logic 16. In this way, tester 20 determines whether the functional paths 17 of core logic 16 are erroneously processing data while ruling out the possibility that the input wrapper chain is the source of discovered errors. Again, for ease, the above is described with respect to the input wrapper chain, and similar errors may propagate through the output wrapper chain with flops 14.

The errors associated with slow connection 19 may occur during the testing but it may be possible to determine that slow connection will occur during design so that measures can be taken, during design, to address issues caused by slow connection 19. In some examples, during a design of logic blocks 10, a set of slow connections like connection 19 which are part of the input wrapper chain are identified such as through simulation. For example, connection link which links flop 12B and flop 12C (i.e., before flop 12C is replaced by SMDF 13) may be identified as a slow connection. Rather than re-designing or re-creating logic block 10A to fix the slow connection, this disclosure describes examples of state machine-driven flop circuitry that is used to modify flop 12C in order to mitigate the impact of the slow connection from connection link 19 between flop 12B and flop 12C, such that the slow connection does not negatively affect a test of core logic 16 performed by the tester 20.

As described, flop 12C may have been part of the design until connection 19 is identified as a slow connection, and then flop 12C is replaced by SMDF 13. In some examples, SMDF 13 includes a flip-flop that is same as flip-flop for other flops 12. However, SMDF 13 includes one or more additional flip-flops, that together form state machine logic (e.g., that together form a state machine-driven flop) which allows SMDF 13 to output known data bit values to core logic 16 during the capture phase of a test performed by tester 20 even in the presence of slow connection 19.

SMDF 13 is an example of a state machine-driven flop that is individually configurable, during the testing, to output a value independent from the scan data being shifted along the scan path and received by the state machine-driven flop. During a load phase, when data is shifted through the scan path with a slow frequency clock signal, SMDF 13 shifts data along the scan path (e.g., outputs the data received at the input of SMDF 13). However, during a capture phase, when data is shift through the scan path with a fast frequency clock signal, SMDF 13 may be configured to disable shifting of the scan data into SMDF 13. Rather, SMDF 13 may be configured to output a value independent from the scan data being shifted along the scan path and received by SMDF 13 during the capture phase.

As one example, SMDF 13 may be configurable, during testing, to maintain, as output, a current value of SMDF 13 that was shifted into SMDF 13 during a previous shift cycle (e.g., during the load phase). As another example, SMDF 13 may be configurable, during testing, to output an inverse of a current value of SMDF 13 that was shifted into SMDF 13 during a previous shift cycle (e.g., during the load phase). Moreover, there may be a plurality of SMDFs, like SMDF 13, in the input wrapper chain. Each of the SMDFs may be individually configurable. For example, SMDF 13 (e.g., a first SMDF) may be configured to output a current value of SMDF 13, and another SMDF (e.g., a second SDMF) in the input wrapper chain may be configured to output an inverse of a current value of the second SDMF. Also, although described with respect to the input wrapper chain, similar operations may occur in the output wrapper chain.

In accordance with one or more examples described in this disclosure, SMDF 13 is a multi-flop state machine rather than a single digital flip-flop. SMDF 13 may also be referred to as a wrapper cell to indicate that there is additional circuitry added to a single flip-flop to form a multi-flop state machine. Similarly, SMDF 15 is a multi-flop state machine rather than a single digital flip-flop. SMDF 15 may also be referred to as a wrapper cell to indicated that there is additional circuitry added to a single flip-flop to form a multi-flop state machine.

As described in more detail, SMDF 13 or SMDF 15 in the input wrapper chain or output wrapper chain, respectively, may include a first flip-flop, a second flip-flop and an exclusive OR (XOR) logic gate, that together form a state machine. Additionally, in some examples, SMDF 13 may include a first multiplexer which controls whether the first flip-flop receives an electrical signal from a previous flop in the input wrapper chain and a second multiplexer which controls whether the second flip-flop receives an electrical signal from the first flip-flop or receives an electrical signal from an output of the second flip-flop. As used herein, the terms "first" flip-flop and "second" flip-flip are not meant to indicate a particular order within a respective SMDF. The terms "first" and "second" are used to distinguish between flip-flops of a respective SMDF.

For ease of illustration and example purposes only, the SMDF 13 and SMDF 15 are described with flip-flops and XOR logic gates. However, the example techniques are not so limited. Other design choices may be available. For example, SMDF 13 or SMDF 15 may be state machine-driven flops that form (e.g., represents) a state machine that are individually configurable to output a current value of the state machine for a maintain operational mode during the capture phase rather than provide an output based on an input signal present at an input of SMDF 13 or SMDF 15. As another example, SMDF 13 or SMDF 15 may be configured to output an inverse of the current value (e.g., toggle operational mode) during the capture phase rather than based on the input received at the flop. Accordingly, SMDF 13 or SMDF 15 is no longer dependent upon outputting values based on the clocking of input values from a previous flop. Rather, SMDF 13 or SMDF 15 are individually configurable to output the current value or the opposite of the current value independent (e.g., regardless) of the value that is output from the previous flop. Forming a state machine with XOR and additional flip-flops is one example way in which to form the state machine, but other ways are also possible.

As described in more detail, an electrical signal output by the first flip-flop SMDF 13 or SMDF 15 may represent a data bit that is referred to herein as a "local data bit" and an electrical signal output by the second flip-flop SMDF 13 or SMDF 15 may represent a data bit that is referred to herein as a "toggle state data bit." As used herein, the term "data bit" may refer to an electrical signal which occupies one of two possible data bit values, a low data bit value or a high data bit value. A low magnitude of a respective electrical signal represents the low data bit value and a high magnitude of the respective electrical signal represents the high data bit value. The data bit value, low or high, of the toggle state data bit indicates whether SMDF 13 and SMDF 15 is in the toggle mode or the maintain mode. For example, the low data bit value may correspond to the maintain mode and the high data bit value may correspond to the toggle mode. Additionally, in some cases, the local data bit includes one of the high data bit value or the low data bit value. The local data bit represents the data bit which SMDF 13 outputs to core logic 16 and outputs to a next flop of the input wrapper chain.

In one or more examples, SMDF 13 may be configured to control whether the local data bit is the high data bit value or the low data bit value during the capture phase such that an identity of the local data bit is not reliant on the slow connection between the modified flop and the previous flop in the input wrapper chain. Such control may be achieved by tester 20 loading the toggle state data bit to the second flip-flop during the load phase of a test operation performed by tester 20, thus setting the modified flop to the toggle mode or the maintain mode, which in turn controls the identity (e.g., high or low) of the local data bit. The maintain mode represents a mode in which SMDF 13 outputs a current value of the local data bit in response to receiving a clock signal (e.g., value shifted in first flip-flop of SMDF 13 during the load phase). The toggle mode represents a mode in which SMDF 13 outputs an opposite of the current value of the local data bit in response to receiving a clock signal (e.g., opposite of value shifted in first flip-flop of SMDF 13 during the load phase). SMDF 15 may operate in a substantially similar manner.

In some examples, tester 20 performs a test operation including a load phase, where tester 20 loads a string of data to flops 12. By directing the string of data to the input wrapper chain during the load phase, tester 20 sets the local data bit of SMDF 13 to either the high data bit value or the low data bit value and tester 20 sets the toggle state data bit of the SMDF 13 to either the high data bit value or the low data bit value. As such, by directing the string of data to the input wrapper chain, tester 20 "programs" SMDF 13 with an initial local data bit value and programs SMDF 13 to be in the toggle mode or the maintain mode. In doing so, tester 20 sets up SMDF 13 (e.g., configures the state machine-driven flop) to perform as expected during the capture phase, without relying on a slow connection between the SMDF 13 and a previous flop in the wrapper chain. To perform as expected, SMDF 13 outputs, during the capture phase, an expected output data bit which allows tester 20 to identify one or more errors in the test operation as being errors caused by core logic 16, rather than being errors caused by the input wrapper chain.

During the load phase of the test operation performed by tester 20, the first flip-flop of SMDF 13 may receive an electrical signal from a previous flop in the input wrapper chain, allowing tester 20 to load a string of data into flops 12 via the set of connections which link flops 12 in order to form the input wrapper chain. During the capture phase, the first flip-flop of SMDF 13 may receive an electrical signal from the XOR logic gate rather than receiving the electrical signal from the previous flop in the wrapper chain via the slow connection. As such, SMDF 13 does not rely on the slow connection for operation while the capture phase is occurring. Rather, SMDF 13 operates, in some examples, based on a signal output by the XOR logic gate, and the XOR logic gate in turn outputs the signal based on a signal from the second flip-flop. In this way, the XOR logic gate may perform one or more operations during the capture phase when clock signals are delivered at the fast clock frequency. During the load phase and the unload phase, however, when the first flop-flop of SMDF 13 receives data via the slow connection, the slow connection does not interfere with the operation of SMDF 13 since clock signals are delivered at the slow clock frequency.

As discussed above, tester 20 may load a string of data to the input wrapper chain and/or output wrapper chain, such that one or more data bits are loaded to each of flops 12. During the capture phase, flops 12 receive a set of capture phase clock signals, causing each flop of flops 12 to output a respective data bit to core logic 16. Core logic 16 include functional paths 17, where each functional path of functional paths 17 represents a path from flops 12 to flops 14 through a set of elements that are a part of core logic 16. Tester 20, in some cases, performs a test operation including the load phase, the capture phase, and the unload phase, in order to determine whether each functional path of functional paths 17 processes data correctly according to the desired logical operations which the respective functional paths 17 are programmed to perform. When flops 12 output the data bit values during the capture phase, the one or more respective functional paths of functional paths 17 are configured to process each data bit output by a flop of flops 12, delivering the respective captured data bits to flops 14. During the unload phase, tester 20 causes flops 14 to unload the captured data to tester 20 for comparison with a set of expected data. When one or more functional paths 17 begin at flops 12, flops 14 may represent a core scan chain configured to capture a set of data.

In accordance with one or more examples described in this disclosure, SMDF 13 output data bit values to core logic 16 based on whether SMDF 13 is configured in a maintain mode or a toggle mode. For example, rather than outputting the data bit received from flop 12B, SMDF 13 may be configured to output a current value in a first flip-flop of SMDF 13 or an inverse of the current value in the first flip-flop of SMDF 13.

FIG. 1 illustrates logic block 10A as including flops 12, flops 14, SMDF 13, SMDF 15, and core logic 16. In some examples, each of logic blocks 10B-10N may also include an input wrapper chain, an output wrapper chain, and core logic. Tester 20 may be configured to test functional paths of any one or more of logic blocks 10 using techniques described herein.

Figure 2:
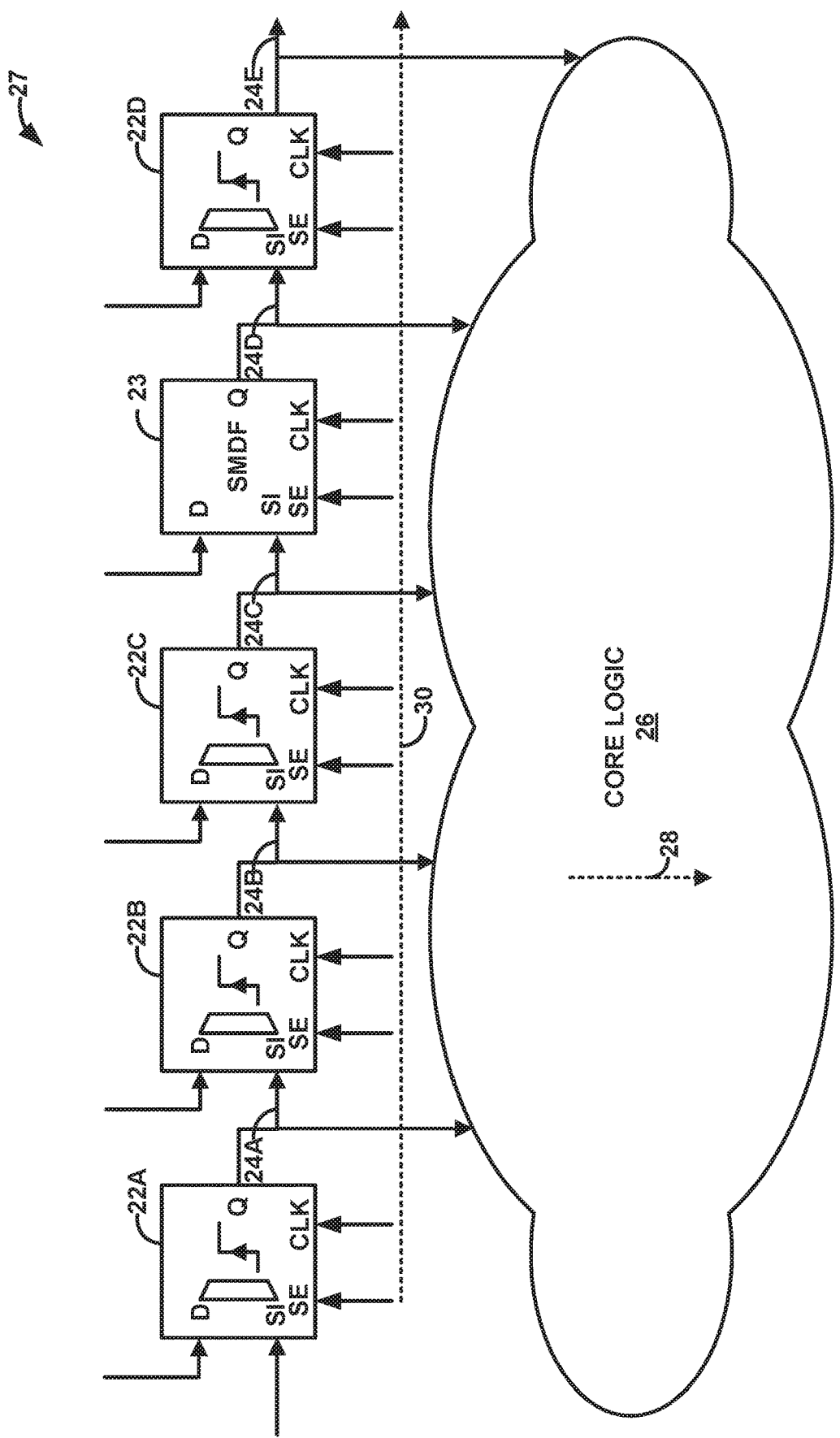
FIG. 2 is a block diagram illustrating a system including an input wrapper chain including flops and a set of input wrapper chain connections, in accordance with one or more techniques of this disclosure.

FIG. 2 is a block diagram illustrating a system 27 including an input wrapper chain including flops 22A-22D and a set of input wrapper chain connections 24A-24E, in accordance with one or more techniques of this disclosure. As illustrated in FIG. 2, rather than the input wrapper chain only including flops like flops 22A-22D, the input wrapper chain includes SMDF 23. For testing, scan data may shift through scan path 30. Except, as described below, because connection 24C is a slow connection in scan path 30, during a capture phase of the testing, SMDF 23 is configured to output a value or inverse of value in SMDF 23 to flop 22D, rather than the value received from connection 24C. During a load phase, SMDF 23 may output to flop 22D the value that SMDF 23 received from flop 22C. FIG. 2 also illustrates core logic 26, which includes functional paths 28, which is similar to functional path 17.

Flops 22A-22D (collectively, "flops 22") are examples of flops 12 of FIG. 1, which form an input wrapper chain. SMDF 23 is an example of SMDF 13 of FIG. 1. Core logic 26 is an example of core logic 16 of FIG. 1. Functional paths 28 are an example of functional paths 17 of FIG. 1. Scan paths 30 are an example of scan paths 19 of FIG. 1.

Input wrapper chain connections 24A-24E (collectively, "input wrapper chain connections 24") represent connections between pairs of consecutive flops of flops 22, except for SMDF 23. For example, as seen in FIG. 2, input wrapper chain connection 24A represents a connection between flop 22A and flop 22B, input wrapper chain connection 24B represents a connection between flop 22B and flop 22C, and so forth, except connection 24C represents a connection between flop 22C and SMDF 23. As such, flops 22, SMDF 23, and input wrapper chain connections 24 form the input wrapper chain.

Each flop of flops 22 and SMDF 23 include a functional data input ("D"), a scan data input ("SI"), and a data output ("Q"). Additionally, each flop of flops 22 and SMDF 23 include a control input ("SE") and a clock input ("CLK").

Flops 22 and SMDF 23 represent flops of an input wrapper chain which are configured to receive data from one or more other systems and output data to core logic 26. For example, during a functional mode of system 27, flops 22 and SMDF 23 may receive electrical signals at respective functional inputs D, and output electrical signals at outputs Q, where the outputs Q are electrically connected to core logic 26. In this way, flops 22 and SMDF 23 may serve as interfaces between core logic 26 and other devices, systems, and circuitry during the functional mode of system 27.

Flops 22 and SMDF 23 may also allow a tester, such as tester 20 of FIG. 1, to perform a test operation of core logic 26 while isolating core logic 26 from other circuitry (e.g., core logic of other logic blocks, outside circuitry, and top logic). In this way, flops 22 and SMDF 23 may function as an isolation input wrapper chain when tester 20 is performing a test operation, meaning that flops 22 and SMDF 23 receive data from tester 20 via the SI inputs rather than receive data from an external source via the D inputs.

A test operation performed by tester 20 may include a load phase, a capture phase, and an unload phase. During the load phase, tester 20 directs a string of data to flops 22 and SMDF 23 via the SI inputs of flops 22 and SMDF 23 and the input wrapper chain connections 24. As such, flops 22 and SMDF 23 receive data at the D inputs or receive data at the SI inputs depending on an operation mode of system 27, and it is possible to control which of the D inputs or the SI inputs deliver data to flops 22 or SMDF 23 by delivering a control signal to the SE inputs. For testing, the MUXes of flops 22 and SMDF 23 may be configured to output data from the SI inputs. However, SMDF 23 may be configured to output data from the SI input during the load phase of the testing. For a capture phase of the testing, SMDF 23 does not output data from the SI input but instead outputs a current value or inverse of current value rather than output data from the SI input. That is, SMDF 23 may be configured to disable shifting of scan data into SMDF 23 (e.g., during testing, such as during the capture phase).

In some examples, each flop of flops 22 is configured to transfer, responsive to receiving a clock signal at the respective clock input CLK, data from one of the functional data input D or the scan data input SI to the data output Q. For example, when flop 22B receives a low data bit value at the scan data input SI and outputs a high data bit at data output Q, flop 22B may transfer, in response to receiving a clock signal at the clock input CLK, the low data bit value from the scan data input SI to the data output Q, causing flop 22B to output the low data bit value to core logic 26 and the scan data input SI of flop 22C. Additionally, in some cases, when flop 22B receives a low data bit value at the functional data input D and outputs a high data bit at data output Q, flop 22B transfers, in response to receiving a clock signal at the clock input CLK, the low data bit value from the functional data input D to the data output Q, causing flop 22B to output the low data bit value to core logic 26. In any case, each flops of flops 22 may be configured to "advance" or "shift" a data bit value in response to receiving a clock signal which initiates the advancement.

Flops 22 and SMDF 23 may receive a sequence of one or more clock signals, causing a data bit to travel through one or more of flops 22. In some examples, a sequence of clock signals includes a first clock signal which transfers a data bit value from the SI input of flop 22A to the Q output of flop 22A, a second clock signal which transfers the data bit value from the SI input of flop 22B to the Q output of flop 22B, a third clock signal which transfers the data bit value from the SI input of flop 22C to the Q output of flop 22C, a fourth clock signal which transfers the data bit value from the SI input of SMDF 23 to the Q output of flop 22D, and so forth. In some examples, a clock signal transfers a data bit value from the D input of flop 22A to the Q output of flop 22A, causing the data bit value to be output to core logic 26. In this example, the D inputs of flops 22 and SMDF 23 are enabled while the SI inputs of flops 22 and SMDF 23 are disabled, meaning that the data bit is transferred through flop 22A to core logic 26 without being transferred to flop 22B. In any case, clock signals received at the clock inputs of flops 22 may cause a propagation of data through one or more flops of the input wrapper chain (e.g., either from previous flop if SI input is selected or from other source if D input is selected).

The control input of a respective flop (e.g., flop 22B) may receive a control signal which causes the flop to receive data from the functional input (e.g., D input) or receive data from the scan input (e.g., SI input). The control signal may include a high control signal magnitude or a low control signal magnitude. For example, when flop 22B receives the control signal at a high control signal magnitude at the SE input of flop 22B, flop 22B may receive data via the SI input of flop 22B without receiving data from the D input of flop 22B. On the other hand, when flop 22B receives the control signal at a low control signal magnitude at the SE input of flop 22B, flop 22B may receive data via the D input of flop 22B without receiving data from the SI input of flop 22B.

In some examples, during a functional mode of system 27, flops 22 forward data from outside of system 27 to core logic 26. For example, during the functional mode of system 27, the control signals received by the SE inputs of flops 22 may represent the low control signal magnitude, causing flops 22 to receive data at the D inputs and output data at the Q outputs. That is, flop 22A receives data at the D input of flop 22A and outputs data via the Q output of flop 22A, flop 22B receives data at the D input of flop 22B and outputs data via the Q output of flop 22B, flop 22C receives data at the D input of flop 22C and outputs data via the Q output of flop 22C, SMDF 23 receives data at the D input of SMDF 23 and outputs data via the Q output of SMDF 23, and flop 22D receives data at the D input of flop 22D and outputs data via the Q output of flop 22D. Clock signals, in this example, cause flops 22 and SMDF 23 to transfer data from the D inputs to the Q outputs while the SI inputs are disabled.

In some cases, system 27 is configured to operate in a scan mode (e.g., for testing). For example, during the functional mode of system 27, the control signals received by the SE inputs of flops 22 may represent the high control signal magnitude, causing flops 22 to receive data at the SI inputs and output data at the Q outputs. That is, flop 22A receives data at the SI input of flop 22A and outputs data via the Q output of flop 22A, flop 22B receives data at the SI input of flop 22B and outputs data via the Q output of flop 22B, flop 22C receives data at the SI input of flop 22C and outputs data via the Q output of flop 22C, and so forth, except for SMDF 23. Clock signals, in this example, cause flops 22 to transfer data from the SI inputs to the Q outputs while the D inputs are disabled, meaning that flops 22 do not transfer data to core logic 26 from the D inputs during the scan mode.

During a load phase of the testing, SMDF 23 outputs, via the Q output of SMDF 23, the data received at the SI input of SMDF 23. However, during a capture phase of the testing, SMDF 23 does not output, via the Q output of SMDF 23, the data received at the SI input of SMDF 23. Rather, SMDF 23 outputs a current value in SMDF 23 or an inverse of the current value in the SMDF 23. For example, during the load phase, SMDF 23 may be configured, based on bits shifted into SMDF 23 during the load phase, to be in a maintain mode or a toggle mode. In the maintain mode, during the capture phase, SMDF 23, to maintain, outputs a current value of SMDF 23 that was shifted into SMDF 23 during a previous shift cycle (e.g., during the load phase). In the toggle mode, during the capture phase, SMDF 23 outputs an inverse of a current value of SMDF 23 that was shifted into SMDF 23 during a previous shift cycle (e.g., during the load phase). In this way, because SMDF 23 can be configured to be a maintain or toggle mode, SMDF 23 is an example of an individually configurable state machine-driven flop that is configurable during testing to output a value independent from the scan data being shifted along the scan path and received by SMDF 23, such as during the capture phase.

A tester, such as tester 20, may perform a test operation of core logic 26 while the scan mode is enabled. The test operation may include a load phase, a capture phase, and an unload phase. During the load phase, tester 20 directs a string of data bits to the input wrapper chain including flops 22 and SMDF 23. In one example, the string of data bits include "01001," the string of data bits representing a first low data bit value (e.g., the first "0"), a first high data bit value (e.g., the first "1"), a second low data bit value, a third low data bit value, and a second high data bit value. Flops 22 and SMDF 23 load the string of data bits during the load phase. For example, flop 22A may receive the first low data bit value at the SI input of flop 22A. Responsive to receiving a sequence of load phase clock signals at the clock inputs of flops 22 and SMDF 23, the flops 22A may load the string of data bit values in sequential order such that flop 22D loads the first low data bit value to the data output Q of flop 22D, SMDF 23 loads the first high data bit value to the data output Q of SMDF 23, flop 22C loads the second low data bit value to the data output Q of flop 22C, flop 22B loads the third low data bit value to the data output Q of flop 22B, and flop 22A loads the second high data bit value to the data output Q of flop 22A.

In general, during the load phase, the frequency of the clock signal received at CLK is relatively slow (e.g., slower than the clock signal used during normal operation). Because the frequency of clock signal during the load phase is relatively slow, even if there is a slow connection, like connection 24C, the impact of connection 24C being slow does not impact the loading of bits into SMDF 23. For example, the clock signal used during the load phase is slow enough that there is sufficient time for the output from flop 22C to propagate to SMDF 23 even though connection 24 is a slow connection.

Following the load phase of the test operation where flops 22 and SMDF 23 load the string of data bit values, tester 20 may execute the capture phase. To execute the capture phase, tester 20 may output a set of two or more capture phase clock signals to the clock inputs of flops 22 and SMDF 23 while the control signal received by each flop of flops 22 remains at the high control signal magnitude, thus enabling the SI inputs of flops 22 and disabling the D inputs of flops 22. When flop 22C receives a capture phase clock signal, for example, flop 22C transfers the data bit value at the SI input of flop 22C (e.g., the data bit output by flop 22B over connection 24B) to the Q output of flop 22C, causing flop 22C to output the data bit to both of core logic 26 and the SI output of flop SMDF 23. In this way, flops 22 may form an "isolation" input wrapper chain which outputs data bit values to core logic 26 from the SI inputs of flops 22 rather than outputting data bit values to core logic 26 from the D inputs of flops 22. The data bit values output by flops 22 during the capture phase may propagate through functional paths 28 to an output wrapper chain or to a core chain. Subsequently, tester 20 may execute the unload phase, and compare the captured data bit values of the output wrapper chain to a set of expected data bit values.

During the capture phase, the frequency of clock signal received at CLK is relatively fast (e.g., the frequency is the same as the frequency at which core logic 26 operates). Because the frequency of the clock signal during the capture phase is relatively fast and connection 24C is a slow connection, there may not be sufficient time for the data to propagate from flop 22C to SMDF 23 before the next clock signal comes for SMDF 23 to output. In accordance with one or more examples described in this disclosure, during the capture phase, SMDF 23 may be configured to output a current value of SMDF 23 or an inverse of the value of SMDF 23 so that impact of connection 24 being a slow connection is mitigated. For instance, regardless of the value of the data bit received at the SI input of SMDF 23, SMDF 23 is configured to output a current value in a flip-flop of SMDF 23 or an inverse of the current value in the flip-flop of SMDF 23.

Figure 3A:
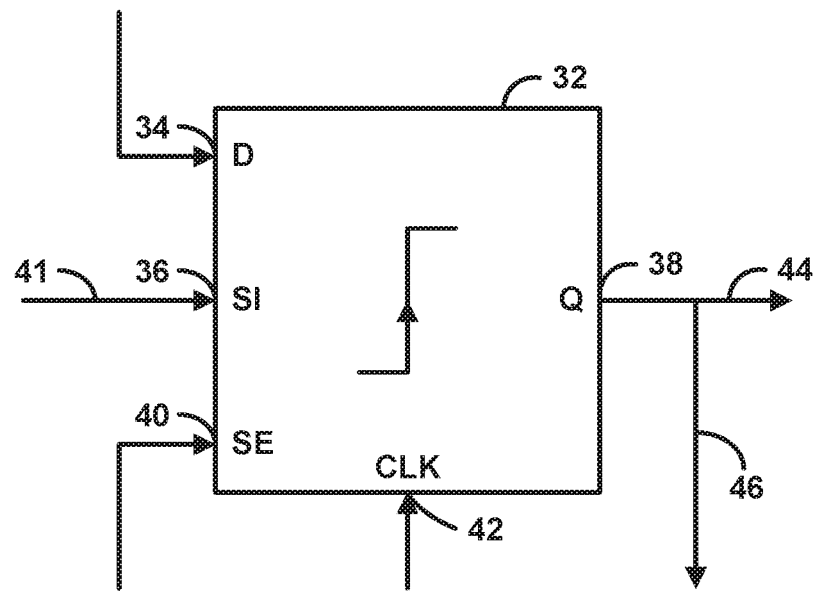
FIG. 3A is a block diagram illustrating a flop including a set of inputs and a set of outputs, in accordance with one or more techniques of this disclosure.

FIG. 3A is a block diagram illustrating a flop 32 including a set of inputs and a set of outputs, in accordance with one or more techniques of this disclosure. Flop 32 includes a functional data input 34, a scan data input 36, a control input 40, a clock input 42, and a data output 38. Data output 38 emits data through both of connection 44 and connection 46. In some examples, flop 32 is an example of one of flops 12 of the input wrapper chain of FIG. 1. In some examples, flop 32 is an example of one of flops 14 of the output wrapper chain of FIG. 1. In some examples, flop 32 is an example of one of flops 22 of FIG. 2.

When flop 32 is part of an input wrapper chain of a logic block such as logic block 10A, functional data input 34 is configured to data from an "outside" environment. The outside environment represents devices and circuitry that are not a part of the logic block on which flop 32 is located. For example, flop 32 may receive data from another logic block, or receive data from top logic of another system. In some examples, scan data input 36 is configured to receive data from a previous flop of the input wrapper chain. when flop 32 is the first flop of the input wrapper chain, scan data input 36 is configured to receive data from a tester (e.g., tester 20 of FIG. 1), or other circuitry. Control input 40 receives a control signal, sometimes referred to herein as a "shift enable" signal. Flop 32 controls whether functional data input or scan data input is enabled based on the control signal received at the control input. When the control signal includes a high control signal magnitude, flop 32 may enable the scan data input 36 and disable the functional data input 34. When the control signal includes a low control signal magnitude, flop 32 may enable the functional data input 34 and disable the scan data input 36.

Data output 38 outputs data via connection 44 and connection 46. When flop 32 is part of an input wrapper chain, connection 44 links flop 32 to a next flop of the input wrapper chain and connection 46 links flop 32 to core logic of the logic block on which flop 32 is located. In some examples, data output 38 outputs a data bit representing either a low data bit value (e.g., "0") or the high data bit value (e.g., "1"). As such, flop 32 is configured to process binary data. Data output 38 emits the data bit via both of connection 44 and connection 46. For example, when data output 38 outputs the low data bit, data output 38 emits an electrical signal at a low voltage such that the electrical signal, including the low voltage, travels across both of connection 44 and connection 46. In this way, circuitry at the end of connection 44 and circuitry at the end of connection 46 may both receive the electrical signal including the low voltage, and thus receive the low data bit value. On the other hand, when data output 38 outputs the high data bit, data output 38 emits an electrical signal at a high voltage such that the electrical signal, including the high voltage, travels across both of connection 44 and connection 46. In this way, circuitry at the end of connection 44 and circuitry at the end of connection 46 may both receive the electrical signal including the high voltage, and thus receive the high data bit value. A magnitude of the high voltage is greater than a magnitude of the low voltage.

Flop 32 may receive one or more clock signals at clock input 42. Clock signals are the signals which drive a flow of data across flop 32. For example, flop 32 may transfer, based on receiving a clock signal, a data bit from an input of flop 32 to an output of flop 32. The input from which flop 32 transfers the data is determined by the control signal received at control input 40. For example, when the control signal includes the low control signal magnitude and flop 32 receives a clock signal, flop 32 transfers a data bit value from the functional data input 34 to the data output 38. When the control signal includes the high control signal magnitude and flop 32 receives a clock signal, flop 32 transfers a data bit value from the scan data input 36 to the data output 38.

Figure 3B:
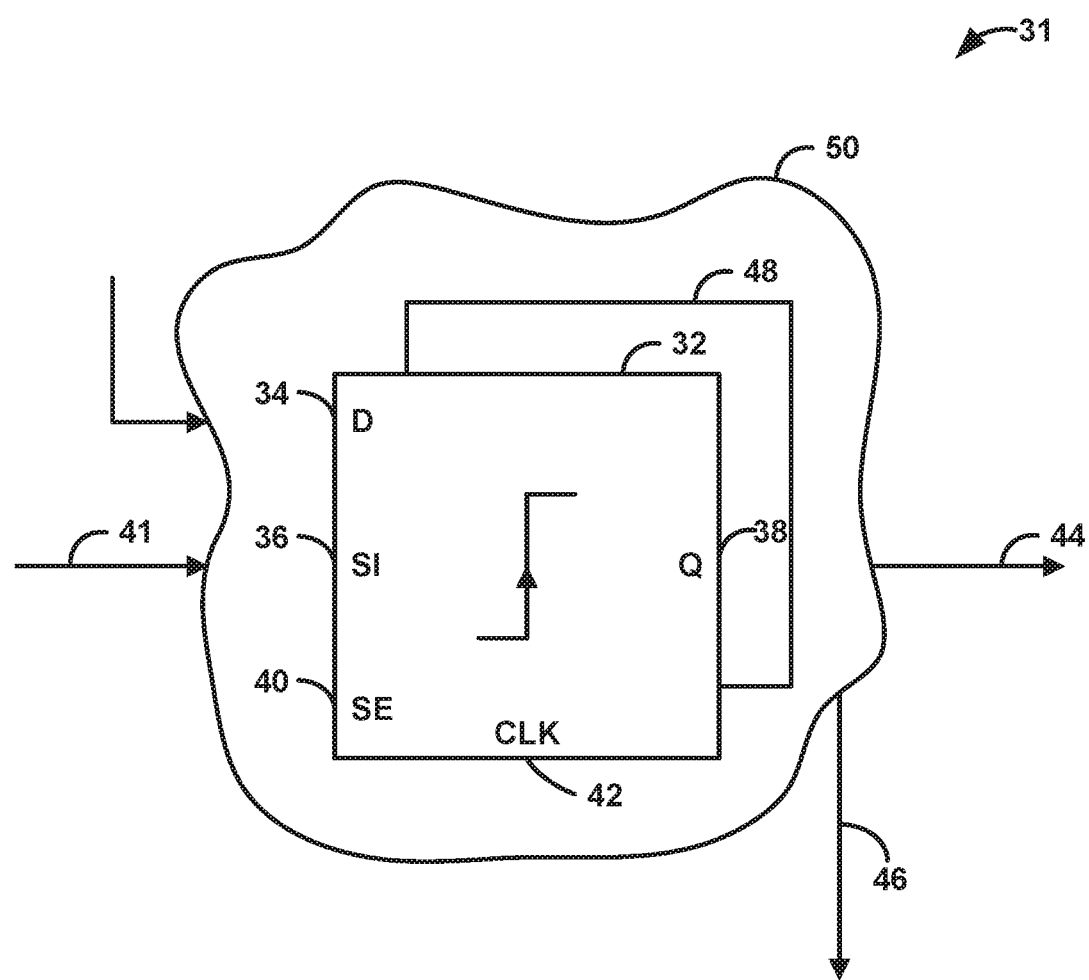
FIG. 3B is a block diagram illustrating one example of a state machine-driven flop, in accordance with one or more techniques of this disclosure.

FIG. 3B is a block diagram illustrating one example of a state machine-driven flop (SMDF) 31. For example, SMDF 31 is an example of a wrapper cell such as a scan wrapper cell that is included in the input wrapper chain or the output wrapper chain.

In some examples, SMDF 31 includes components similar to those of flop 32 of FIG. 3A with additional circuitry to form the state machine. However, the examples for SMDF 31 are not limited as such.

In the example illustrated in FIG. 3B, SMDF 31 includes primary flop 32, added flop 48, and state machine logic 50, in accordance with one or more techniques of this disclosure. Accordingly, SMDF 32 is a multi-flop state machine-driven flop. The primary flop 32 includes a functional data input 34, a scan data input 36, a control input 40, a clock input 42, and a data output 38. The added flop 48, in some cases, includes a functional data input, a scan data input, a control input, a clock input, and a data output. In this way, the added flop 48 may be substantially the same as the primary flop 32. SMDF 31 may represent an alteration of primary flop 32 such that added flop 48 and state machine logic 50 are integrated with flop 32. Accordingly, SMDF 31 is an enhanced flop that is state machine-driven, where the enhancement is from the additional circuitry and additional flops used to form the state machine. In some examples, during the design, connection 41 is identified as a slow connection. Flop 32 may be supplemented with additional flop 48 and state machine logic 50 such that slow connection 41 does not negatively affect a test operation of core logic while modified flop 31 is operating in the scan mode. For example, flop 32 may be replaced with a scan wrapper cell such as SMDF 31 of FIG. 3B.

Figure 4:
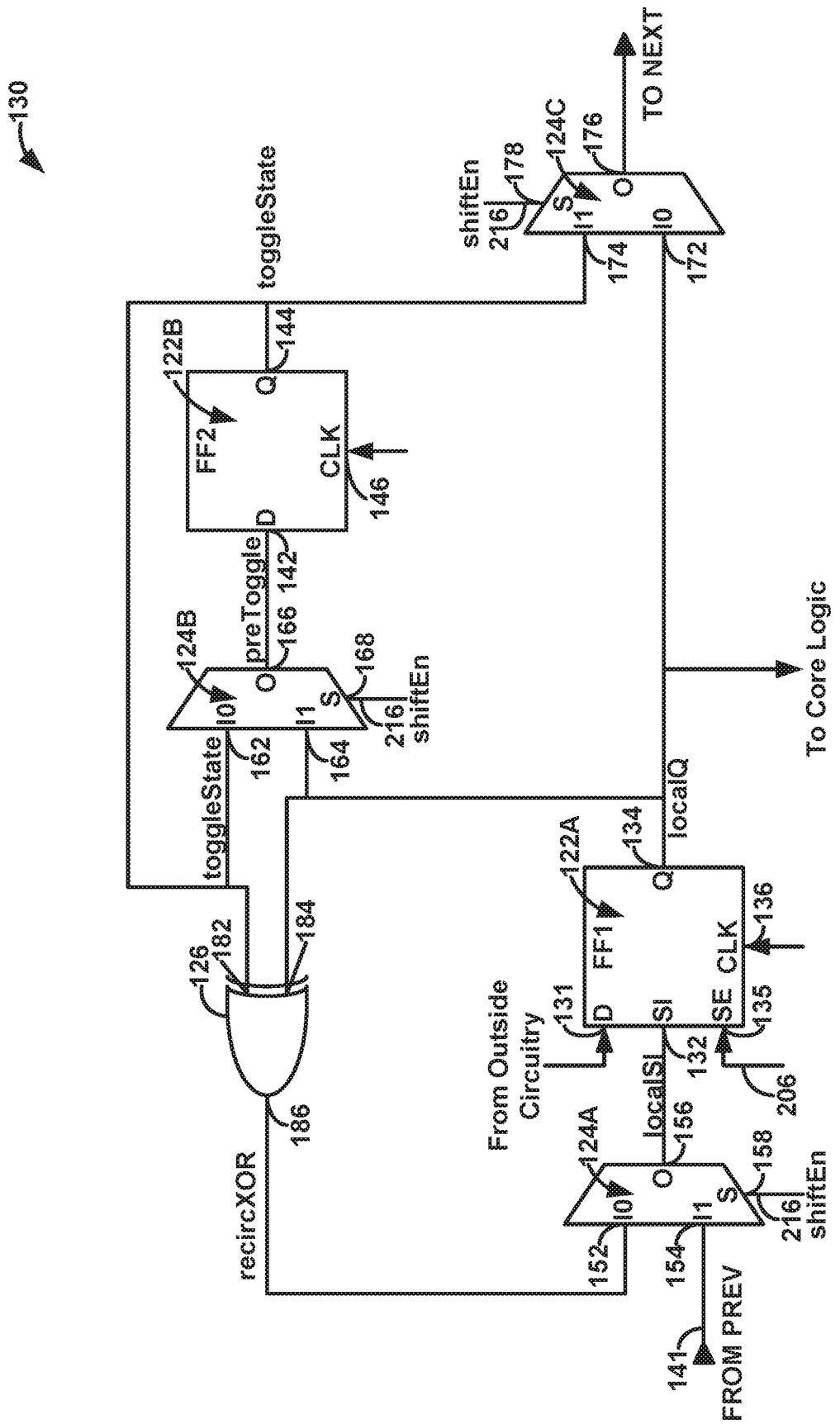
FIG. 4 is a block diagram illustrating a state machine-driven flop located at an end of a slow connection, in accordance with one or more techniques of this disclosure.

FIG. 4 is a block diagram illustrating scan wrapper cell 130 that forms a multi-flop state machine-driven flop located at an end of connection 141, in accordance with one or more techniques of this disclosure. Connection 141 is a slow connection in the scan path between flops in the wrapper chain. Scan wrapper cell 130 is an example of a state machine-driven flop (SMDF) that provides immunity from the impact of connection 141 being a slow connection. Accordingly, scan wrapper cell 130 may be a scan wrapper cell that provides shift path delay immunity. Shift path delay refers to the delay from shifting data between flops during a capture phase of the testing.

As seen in FIG. 4, cell 130 includes flip-flops 122A-122B (collectively, "flip-flops 122"), multiplexers 124A-24C (collectively, "multiplexers 124"), and exclusive OR (XOR) logic gate 126. First flip-flop 122A includes a first flip-flop functional data input 131, a first flip-flop scan data input 132, a first flip-flop data output 134, a first flip-flop control input 135, and a first flip-flop clock input 136. Second flip-flop 122B includes a second flip-flop data input 142, a second flip-flop data output 144, and a second flip-flop clock input 146. First multiplexer 124A includes a first multiplexer data input 152, a second multiplexer data input 154, a first multiplexer data output 156, and a first multiplexer control input 158. Second multiplexer 124B includes a third multiplexer data input 162, a fourth multiplexer data input 164, a second multiplexer data output 166, and a second multiplexer control input 168. Third multiplexer 124C includes a fifth multiplexer data input 172, a sixth multiplexer data input 174, a third multiplexer data output 176, and a third multiplexer control input 178. XOR logic gate 126 includes a first XOR data input 182, a second XOR data input 184, and an XOR data output 186.

Cell 130 is configured to operate during both of a functional mode of logic block 10A and a scan mode of logic block 10A. During the functional mode of block 10A, cell 130 may operate similar to a non-modified flop such as flop 32 of FIG. 3A. For example, during the functional mode, flip-flop 122A may receive a control signal 206 at first flip-flop control input 135, causing flip-flop 122A to activate first flip-flop functional data input 131 and deactivate first flip-flop scan data input 132. As such, during the functional mode of logic block 10A, flip-flop 122A may transfer data from the first flip-flop functional data input 131 to the first flip-flop data output 134. In other words, flip-flop 122A may transfer data from circuitry outside of logic block 10A to core logic 16 of logic block 10A. In this way, cell 130 may rely on flip-flop 122A to transfer data from the outside circuitry to the core logic while the functional mode is enabled without relying on second flip-flop 122B, first multiplexer 124A, second multiplexer 124B, and XOR logic gate 126.

Flip flops 122, multiplexers 124, and XOR logic gate 126 may operate while the scan mode of logic block 10A is enabled in order to prevent connection 141 from adversely affecting a test of core logic 16. In other words, cell 130 may provide immunity from the delay caused by connection 141 during testing such that tester 20 can definitively determine that the one or more errors are caused by core logic 16 rather than the input/output wrapper chains of logic block 10A.

In some examples, tester 20 executes a test operation which includes a load phase, a capture phase, and an unload phase. During the load phase, cell 130 is configured to process data received from previous flop through connection 141. For example, first multiplexer 124A receives a control signal 216 at first multiplexer control input 158 causing first multiplexer 124A to activate second multiplexer data input 154 and deactivate first multiplexer data input 152 and second multiplexer 124B receives a control signal 216 at second multiplexer control input 168 causing second multiplexer 124B to activate fourth multiplexer data input 164 and deactivate third multiplexer data input 162. Tester 20 may load a data bit value to the first flip-flop data output 134 of first flip-flop 122A and tester 20 may load a data bit value to the second flip-flop data output 144 of second flip-flop 122B during the load phase.

In order to "load" the data bit value to the first flip-flop data output 134 of first flip-flop 122A load the data bit value to the second flip-flop data output 144 of second flip-flop 122B, the respective clock inputs of first flip-flop 122A and second flip-flop 122B may receive a set of load phase clock signals which cause flip-flops 122 to advance data bits through cell 130. Since second multiplexer data input 154 and fourth multiplexer data input 164 are activated during the load phase, the advancement of data bits through cell 130 during the load phase may occur as follows.

First flip-flop clock input 136 may receive a first load phase clock signal which causes first flip-flop 122A to advance a first data bit from the first flip-flop scan data input 132 to the first flip-flop data output 134, thus outputting the first data bit to the second flip-flop data input 142 via multiplexer 124B. Additionally, the first load phase clock signal causes first flip-flop scan data input 132 to receive a second data bit via connection 141 and multiplexer 124A. Second flip-flop clock input 146 and first flip-flop clock input 136 may receive a second load phase clock signal which causes second flip-flop 122B to advance the first data bit from the second flip-flop data input 142 to the second flip-flop data output 144. Additionally, the second load phase clock signal causes first flip-flop 122A to advance the second data bit from the first flip-flop scan data input 132 to the first flip-flop data output 134. In this way, after first flip-flop 122A and second flip-flop 122B receive the first load phase clock signal and the second load phase clock, signal, the first data bit may be loaded to the second flip-flop data output 144 and the second data bit may be loaded to the first flip-flop data output 134. As such, the first data bit may represent a "toggleState" data bit, and the second data bit may represent a "localQ" data bit which is output to the core logic.

In some examples, the localQ data bit represents either a low data bit value "0" or a high data bit value "1." Additionally, the toggleState data bit may represent either the low data bit value or the high data bit value. An identity (e.g., low data bit value or high data bit value) of the localQ data bit value and an identity of the toggleState data bit value may determine how cell 130 operates during the capture phase of the test operation executed by tester 20. As such, it may be beneficial to program the localQ data bit and the toggleState data bit such that cell 130 proceeds without relying on connection 141 during the test operation, which connects cell 130 with a previous flop in the input wrapper chain. In order to program the localQ data bit and the toggleState data bit, it may be possible to customize the string of data directed to the input wrapper chain such that the two consecutive data bits of the string of data which represent the localQ data bit and the toggleState data bit, respectively, include desired data bit values. For example, it may be possible to generate the string of data such that the toggleState data bit is a "1" and the localQ data bit, which is consecutive to the toggleState data bit in the string of data, is a "0." When the input wrapper chain loads the string of data, cell 130 may load the string of data, thus "programming" the localQ data bit and the toggleState data bit.

During the capture phase of the test operation, cell 130 may be configured to operate in one of a toggle state and a maintain state. That is, cell 130 toggles a value of the localQ data bit responsive to receiving a capture phase clock signal when cell 130 is operating in the toggle mode, and cell 130 maintains a value of the localQ data bit responsive to receiving a capture phase clock signal when cell 130 is operating in the maintain mode. When the toggleState data bit is a "1," cell 130 operates in the toggle mode and when the toggleState data bit is a "0," cell 130 operates in the maintain mode. Consequently, by generating the string of data to include a customized value of the toggleState data bit so that when loaded to the second flip-flop data output 144, the toggleState data bit guides the operation of cell 130.

Cell 130 may operate according to one of four bit combinations. The first bit combination occurs when the localQ data bit is a "0" and the toggleState data bit is a "0." The second bit combination occurs when the localQ data bit is a "0" and the toggleState data bit is a "1." The third bit combination occurs when the localQ data bit is a "1" and the toggleState data bit is a "0." The fourth bit combination occurs when the localQ data bit is a "1" and the toggleState data bit is a "1." When cell 130 receives a capture phase clock signal while the first bit combination is loaded to flip-flops 122, first flip-flop 122A maintains the localQ data bit value at a "0" and second flip-flop 122B maintains the toggleState data bit value at a "0." When cell 130 receives a capture phase clock signal while the second bit combination is loaded to flip-flops 122, first flip-flop 122A toggles the localQ data bit value from a "0" to a "1" and second flip-flop 122B maintains the toggleState data bit value at a "1." When cell 130 receives a capture phase clock signal while the third bit combination is loaded to flip-flops 122, first flip-flop 122A maintains the localQ data bit value at a "1" and second flip-flop 122B maintains the toggleState data bit value at a "0." When cell 130 receives a capture phase clock signal while the fourth bit combination is loaded to flip-flops 122, first flip-flop 122A toggles the localQ data bit value from a "1" to a "0" and second flip-flop 122B maintains the toggleState data bit value at a "1."

XOR logic gate 126 causes cell 130 to toggle the localQ data bit during the toggle phase and maintain the localQ data bit during the maintain phase. For example, when the second bit combination is loaded to flip-flops 122, the toggleState data bit is a "1," meaning that the cell 130 is in the toggle mode. The second flip-flop data output 144 outputs the "1" data bit to the first XOR data input 182. Additionally, when the second bit combination is loaded to flip-flops 122, the localQ data bit is a "0," meaning that the first flip-flop data output 134 outputs the "0" data bit to the second XOR data input 184. XOR logic gate 126 outputs either a "0" data bit value or a "1" data bit value based on the data bit values sent to the first XOR data input 182 and the second XOR data input 184. For example, when a sum of the data bits sent to the first XOR data input 182 and the second XOR data input 184 is odd, XOR logic gate 126 outputs a "1" data bit value. When a sum of the data bits sent to the first XOR data input 182 and the second XOR data input 184 is even, XOR logic gate 126 outputs a "0" data bit value. As such, in the case of the second bit combination, XOR logic gate 126 outputs a "1" data bit value since the first XOR data input 182 receives a "1" data bit and the second XOR data input 184 receives a "0" data bit, meaning that the two data bits received by the XOR data inputs have an odd sum of 1. This causes flip-flop 122A to receive a "1" data bit value at the first flip-flop scan data input 132, since during the capture phase, the first multiplexer data input 152 is enabled in order to connect the XOR data output 186 with the first flip-flop scan data input 132.

Although flop 130 includes an XOR logic gate 126, one or more other logic gates may be configured to perform one or more techniques described herein as being performed by XOR logic gate 126. An XOR logic gate may represent one type of next state logic element. In some examples, another next state logic element or combination of next state logic elements may perform one or more techniques described herein as being performed by XOR logic gate 126. In some examples, a multiplexer (MUX), an exclusive NOR (XNOR) logic gate, an AND-OR-Invert (AOI) logic gate, another type of next state logic gate, or any combination thereof may perform one or more techniques described herein as being performed by XOR logic gate 126.

Responsive to first flip-flop clock input 136 receiving a capture phase clock signal when the second bit combination is loaded to flip-flops 122, flip-flop 122A transfers the "1" data bit value from the first flip-flop scan data input 132 to the first flip-flop data output 134, thus toggling the localQ data bit value from "0" to "1." Flip-flop 122B receives the capture phase clock signal at second flip-flop clock input 146, causing flip-flop 122B to maintain the toggleState data bit at the "1" data bit value. This is because during the capture phase, the third multiplexer data input 162 is activated and the fourth multiplexer data input 164 is deactivated, causing the second flip-flop data output 144 to be connected to the second flip-flop data input 142.

Although cell 130 is illustrated as including two flip-flops (e.g., flip-flop 122A and flip-flop 122B), one or more example flops not illustrated in FIG. 4 may include more than two flip-flops. The one or more example flops may include additional logic gates and additional circuitry which allow the one or more example flops to output a desired data bit.

Figure 5:
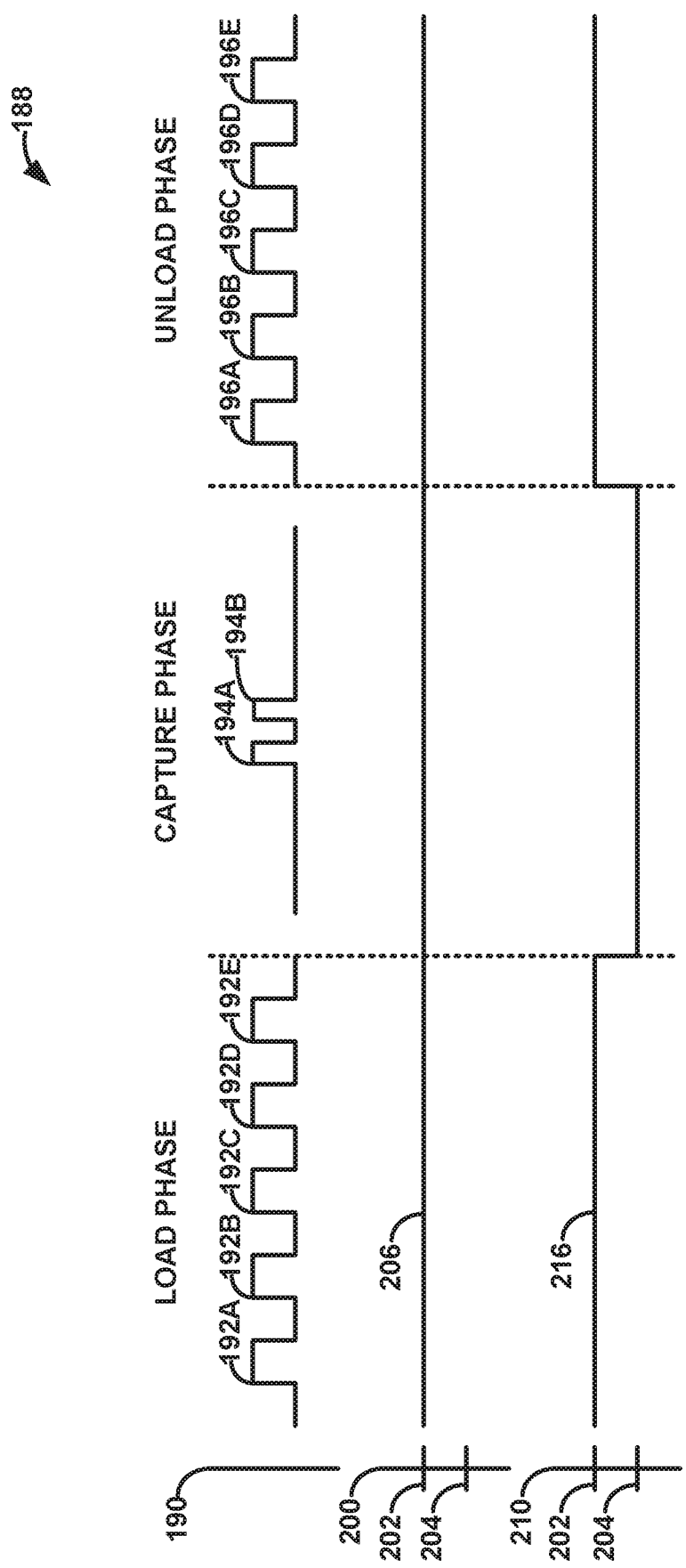
FIG. 5 is a graph illustrating a clock signal plot, a first control signal plot, and a second control signal plot for loading, capturing, and unloading data through flops in an input or output wrapper chain, in accordance with one or more techniques of this disclosure.

FIG. 5 is a graph 188 illustrating a clock signal plot 190, a first control signal plot 200, and a second control signal plot 210, in accordance with one or more techniques of this disclosure. As seen in FIG. 5, clock signal plot 190 includes a set of load phase clock signals 192A-192E (collectively, "load phase clock signals 192"), a set of capture phase clock signals 194A-194B (collectively, "capture phase clock signals 194"), and a set of unload phase clock signals 196A-196E (collectively, "unload phase clock signals 196"). The first control signal plot 200 includes a first control signal 206, which is at a high control signal value 202 throughout the load phase, the capture phase, and the unload phase. The second control signal plot 210 includes a second control signal 216, which is at the high control signal value 202 during the load phase, at a low control signal value 204 during the capture phase, and at the high control signal value 202 during the unload phase. FIG. 5 is described with respect to system 2 of FIG. 1 and flop 130 of FIG. 3. However, the techniques of FIG. 5 may be performed by different components of system 2 or flop 130, or by additional or alternative systems and devices.

During the load phase, an input wrapper chain, such as flops 12 of FIG. 1, may receive a set of load phase clock signals 192. Additionally, tester 20 may direct a string of data bits towards the input wrapper chain. Load phase clock signals 192 cause flops 12 to load the string of data bits via scan inputs without loading data bits using functional inputs. In other words, flops 12 may represent an input wrapper chain which isolates logic block 10A from outside circuitry other than test circuitry during the test operation. In some examples, load phase clock signals 192 cause each flop of flops 12 to load at least one data bit. In a case an SMDF (e.g., SMDF 13, 15, 23, or cell 130), the SMDF may load more than one data bit during the load phase. For example, cell 130 includes a first flip-flop 122A and a second flip-flop 122B. The first flip-flop 122A may load a localQ data bit and the second flip-flop 122B may load a toggleState data bit during the load phase.

First control signal 206 and second control signal 216 may represent control signals which are delivered to different components of cell 130 during a test operation performed by tester 20. For example, first flip-flop 122A may receive first control signal 206 at first flip-flop control input 135. First multiplexer 124A, second multiplexer 124B, and third multiplexer 124C receive second control signal 216 at first multiplexer control input 158, second multiplexer control input 168, and third multiplexer control input 178, respectively. During the load phase, both of the first control signal 206 and the second control signal 216 are at the high control signal value 202. This means that data is configured to pass through cell 130 via both of first flip-flop 122A and second flip-flop 122B. At the high control signal value 202, the first control signal 206 activates first flip-flop scan data input 132 and deactivates first flip-flop functional data input 131, allowing first flip-flop 122A to transfer data from first flip-flop scan data input 132 to first flip-flop data output 134 and preventing first flip-flop 122A from transferring data from the first flip-flop functional data input 131. For example, during the load phase, a data bit may arrive at cell 130 via connection 141, transfer across first flip-flop 122A to second flip-flop 122B, and transfer across second flip-flop 122B to a next flop of the input wrapper chain.

Following the load phase, tester 20 may execute a capture phase. During the capture phase, first control signal 206 remains at the high control signal value 202 and the second control signal 216 switches to the low control signal value 204. Consequently, first flip-flop 122A continues to transfer data from the first flip-flop scan data input 132 in response to receiving capture phase clock signals 194, and multiplexers 124 enable the "I0" inputs 152, 162, and 172 during the capture phase. This means that first flip-flop scan data input 132 receives data from XOR data output 186 rather than relying on receiving data via connection 141 during the capture phase, thus preventing connection 141 from causing errors in the test operation when connection 141 is slow.

Accordingly, first flip-flop 122A includes a current value and based on the value in second flip-flop 122B (e.g., whether cell 130 is configured for toggle mode or maintain mode), cell 130 may output the current value or the inverse of the current value. In one or more examples, such as where there are multiple cells 130 in the input or output wrapper chain, one of the cells 130 (e.g., a first SMDF) may be configured in the toggle mode based on the value in the second flip-flop of the first SMDF and another one of the cells 130 (e.g., a second SMDF) may be configured in the maintain mode based on the value in the second flip-flop of second SMDF.

The unload phase follows the capture phase. During the unload phase, first control signal 206 remains at the high control signal value 202 and the second control signal 216 switches to back to the high control signal value 202. Unload phase clock signals 196 may cause an output wrapper chain (e.g., flops 14 of FIG. 1) to send a string of captured data bits to tester 20 for analysis.

Figure 6:
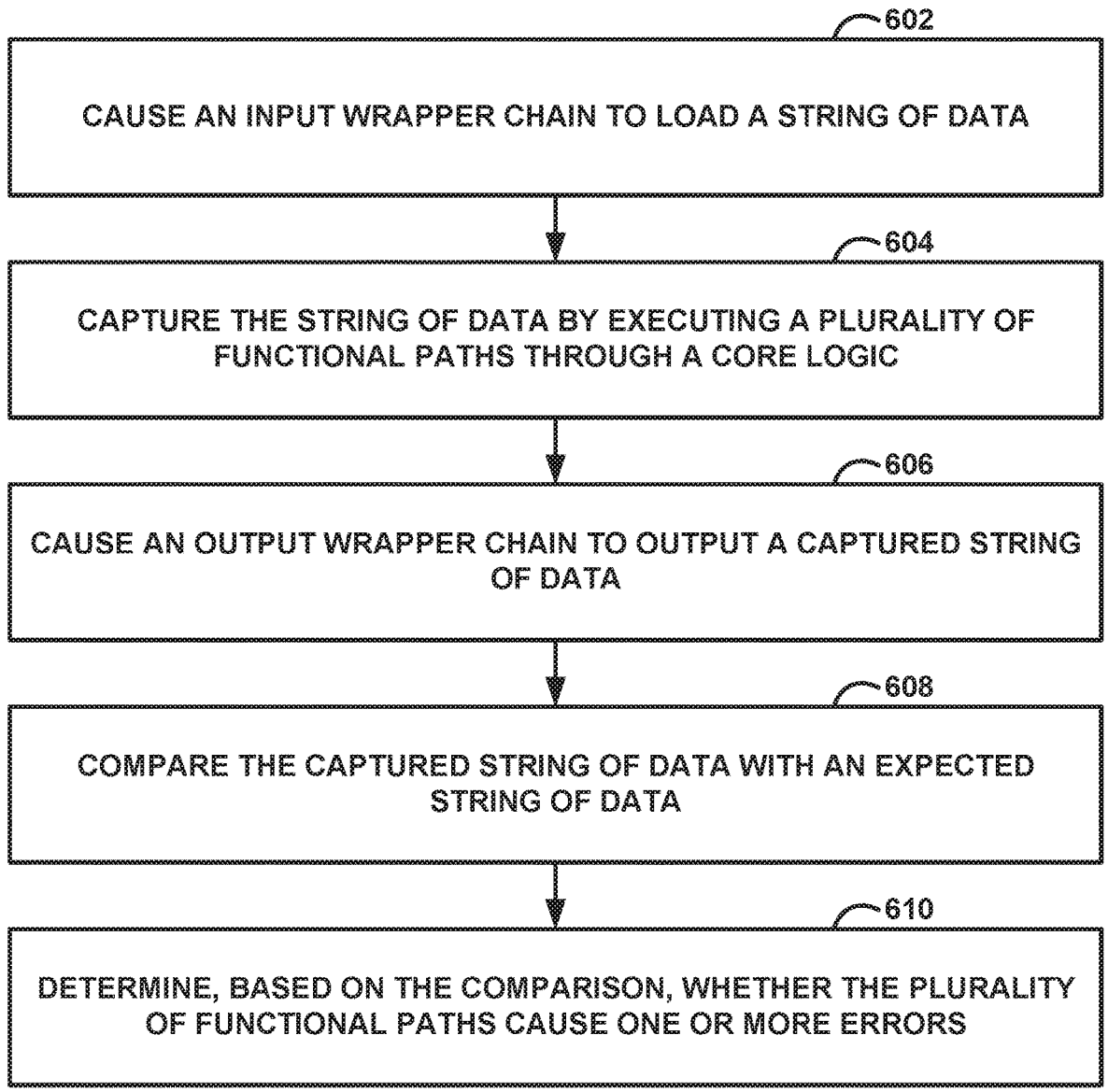
FIG. 6 is a flow diagram illustrating an example operation for performing a test operation, in accordance with one or more techniques of this disclosure.

FIG. 6 is a flow diagram illustrating an example operation for performing a test operation, in accordance with one or more techniques of this disclosure. FIG. 6 is described with respect to system 2 of FIG. 1 and cell 130 of FIG. 4. However, the techniques of FIG. 6 may be performed by different components of system 2 or cell 130, or by additional or alternative systems and devices.

To execute a load phase of a test operation, tester 20 causes an input wrapper chain, such as flops 12 and SMDF 13 of FIG. 1, to load a string of data (602). For example, the flops 12 and SMDF 13 may receive a set of load phase clock signals, causing flops 12 and SMDF 13 to load the string of data. After the input wrapper chain loads the string of data, logic block 10A captures the string of data by executing a plurality of functional paths 17 through core logic 16 (604). For example, flops 12 and SMDF 13 may receive a set of capture phase clock signals which cause flops 12 and SMDF 13 to send the string of data bits through the functional paths 17 to flops 14. In this way, functional paths 17 may perform one or more logical operations in order to generate a string of captured data bits. Tester 20 causes an output wrapper chain, such as flops 14 and SMDF 15 of FIG. 1, to output a captured string of data (606). For example, output flops 14 and SMDF 15 may receive a set of unload phase clock signals, causing output flops 14 and SMDF 15 to output the string of captured data bits to tester 20.

Tester 20 may compare the captured string of data with an expected string of data (608). The expected string of data may represent a string of data bits which functional paths 17 are expected to generate given the string of data loaded by the input wrapper chain. Differences between the captured string of data and the expected string of data may be caused by errors in core logic 16. As such, tester 20 may be configured to determine, based on the comparison, whether functional paths 17 cause one or more errors (610).

The techniques described herein may be implemented in hardware, software, firmware, or any combination thereof. Various features described as modules, units or components may be implemented together in an integrated logic device or separately as discrete but interoperable logic devices or other hardware devices. In some cases, various features of electronic circuitry may be implemented as one or more integrated circuit devices, such as an integrated circuit chip or chipset.

If implemented in hardware, this disclosure may be directed to an apparatus such as a processor or an integrated circuit device, such as an integrated circuit chip or chipset. Alternatively, or additionally, if implemented in software or firmware, the techniques may be realized at least in part by a computer-readable data storage medium including instructions that, when executed, cause a processor to perform one or more of the methods described above. For example, the computer-readable data storage medium may store such instructions for execution by a processor.

A computer-readable medium may form part of a computer program product, which may include packaging materials. A computer-readable medium may include a computer data storage medium such as random access memory (RAM), read-only memory (ROM), non-volatile random access memory (NVRAM), electrically erasable programmable read-only memory (EEPROM), Flash memory, magnetic or optical data storage media, and the like. In some examples, an article of manufacture may include one or more computer-readable storage media.

In some examples, the computer-readable storage media may include non-transitory media. The term "non-transitory" may indicate that the storage medium is not embodied in a carrier wave or a propagated signal. In certain examples, a non-transitory storage medium may store data that can, over time, change (e.g., in RAM or cache).

The code or instructions may be software and/or firmware executed by processing circuitry including one or more processors, such as one or more digital signal processors (DSPs), general purpose microprocessors, application-specific integrated circuits (ASICs), field-programmable gate arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, functionality described in this disclosure may be provided within software modules or hardware modules.

What is claimed is:

1. An integrated circuit (IC) comprising:
   a core logic having functional logic elements;
   a wrapper chain having a plurality of flops for testing the core logic, wherein the plurality of flops of the wrapper chain are sequentially interconnected along a scan path for shifting scan data through successive ones of the flops during testing of the core logic; and
   at least one state machine-driven flop connected along the scan path of the wrapper chain,
   wherein the state machine-driven flop is individually configurable, during the testing, to output to the core logic a first value independent from the scan data being shifted along the scan path and received by the state machine-driven flop, and
   wherein at least one flop of the plurality of flops is set to output to the core logic a second value that is equal to the scan data being shifted along the scan path and received by the at least one flop.

2. The IC of claim 1, wherein the state machine-driven flop is configurable, during testing, to maintain, as output, a current value of the state machine-driven flop that was shifted into the state machine-driven flop during a previous shift cycle of the wrapper chain.

3. The IC of claim 1, wherein the state machine-driven flop is configurable, during testing, to output an inverse of a current value of the state machine-driven flop that was shifted into the state machine-driven flop during a previous shift cycle of the wrapper chain.

4. The IC of claim 1, wherein the state machine-driven flop is configurable, during testing, to disable shifting of scan data into state machine-driven flop.

5. The IC of claim 1, wherein the wrapper chain comprises one of: (1) an input wrapper chain including a first plurality of flops to provide input data to test the core logic, or (2) an output wrapper chain including a second plurality of flops to receive output data from the core logic.

6. The IC of claim 1, wherein a connection between the state machine-driven flop and a previous flop in the wrapper chain propagates data to the state machine-driven flop at a rate less than an operational rate of the core logic.

7. The IC of claim 1, wherein the at least one state machine-driven flop is a first state machine-driven flop configured to output a current value of the first state machine-driven flop, wherein the IC further comprises a second state machine-driven flop configured to output an inverse of a current value of the second state machine-driven flop.

8. The IC of claim 1, wherein the state machine-driven flop comprises a first flip-flop and a second flip-flop, wherein a value shifted in the first flip-flop is a current value of the state machine-driven flop, and a value shifted in the second flip-flop configures the state machine-driven flop to output the current value of the state machine-driven flop or an inverse of the current value of the state machine-driven flop.

9. The IC of claim 8, wherein the state machine-driven flop is configured to:
   load a first data bit of an input string of data during a load phase to the first flip-flop, wherein the first data bit represents a local data bit,
   load a second data bit of the input string of data during the load phase to the second flip-flop, wherein the second data bit represents a toggle state data bit which indicates whether the state machine-driven flop is in a toggle mode or in a maintain mode,
   wherein when the state machine-driven flop is in the maintain mode, the state machine-driven flop outputs a current value of the local data bit, and
   wherein when the state machine-driven flop is in the toggle mode, the state machine-driven flop outputs the inverse of the current value of the local data bit.

10. The IC of claim 1, wherein during a load phase of the testing, the plurality of flops and the state machine-driven flop are configured to load data bits received from connections with respective flops, in response to a clock signal having a first frequency, and wherein during a capture phase of the testing, the state machine-driven flop is configured to output the value independent from the scan data being shifted, in response to the clock signal having a second frequency that is greater than the first frequency.

11. The IC of claim 1, wherein the state machine-driven flop includes a next state logic gate including a first next state logic gate input, a second next state logic gate input, and a next state logic gate output.

12. The IC of claim 11, wherein when the state machine-driven flop is operating in a toggle mode to output an inverse of a current value, the second flip-flop is configured to forward a toggle mode data bit value to the first next state logic gate input, and the next state logic gate is configured to toggle, in response to receiving the toggle mode data bit value, the current value to the inverse of the current value.

13. The IC of claim 11, wherein when the state machine-driven flop is operating in a maintain mode to output a current value, the second flip-flop is configured to forward a maintain mode data bit value to the first next state logic gate input, and the next state logic gate is configured to maintain, in response to receiving the maintain mode data bit value at the first next state logic gate input, the current value.

14. The IC of claim 1,
   wherein the wrapper chain comprises an input wrapper chain, and wherein the IC further includes an output wrapper chain,
   wherein the input wrapper chain is configured to:
      load, during a load phase responsive to receiving a set of load phase clock signals at a slow clock frequency, an input string of data from a tester,
   wherein the output wrapper chain is configured to:
      capture, during a capture phase responsive to receiving a set of capture phase clock signals at a fast clock frequency, a captured string of data from a plurality of functional paths through the core logic; and
      unload, during an unload phase responsive to receiving a set of unload phase clock signals at the slow clock frequency, the captured string of data to the tester.

15. A system comprising:
   a tester; and
   an integrated circuit (IC) comprising:
      a core logic having functional logic elements;
      an input wrapper chain having a plurality of flops for testing the core logic, wherein the plurality of flops of the wrapper chain are sequentially interconnected along a scan path for shifting scan data through successive ones of the flops during testing of the core logic;
      an output wrapper chain; and
      at least one state machine-driven flop connected along the scan path of the input wrapper chain, wherein the state machine-driven flop is individually configurable, during the testing, to output a value independent from the scan data being shifted along the scan path and received by the state machine-driven flop;
   wherein the input wrapper chain is configured to:
      load, during a load phase responsive to receiving a set of load phase clock signals at a slow clock frequency, an input string of data from the tester so as to load values into the plurality of flops and configure the state machine-driven flop to output the value independent from the scan data being shifted along the scan path;
   wherein the output wrapper chain is configured to:
      capture, during a capture phase responsive to receiving a set of capture phase clock signals at a fast clock frequency, a captured string of data from a plurality of functional paths through the core logic; and
      unload, during an unload phase responsive to receiving a set of unload phase clock signals at the slow clock frequency, the captured string of data to the tester.

16. The system of claim 15, wherein the tester is configured to:
   compare the captured string of data with an expected string of data, wherein the expected string of data represents data which the core logic is expected to generate based on the input string of data; and determine, based on the comparison, whether the plurality of functional paths perform one or more errors in generating the captured string of data.

17. The system of claim 15, wherein the state machine-driven flop is configurable, during testing, to maintain, as output, a current value of the state machine-driven flop that was shifted into the state machine-driven flop during a previous shift cycle of the wrapper chain.

18. The system of claim 15, wherein the state machine-driven flop is configurable, during testing, to output an inverse of a current value of the state machine-driven flop that was shifted into the state machine-driven flop during a previous shift cycle of the wrapper chain.

19. The system of claim 15, wherein the state machine-driven flop is configurable, during testing, to disable shifting of scan data into state machine-driven flop.

20. The system of claim 15, wherein the state machine-driven flop comprises a first flip-flop and a second flip-flop, wherein a value shifted in the first flip-flop is a current value of the state machine-driven flop, and a value shifted in the second flip-flop configures the state machine-driven flop to output the current value of the state machine-driven flop or an inverse of the current value of the state machine-driven flop.

* * * * *